United States Patent
Tseng et al.

(10) Patent No.: US 11,393,946 B2
(45) Date of Patent: Jul. 19, 2022

(54) MICRO LED STRUCTURE

(71) Applicant: PlayNitride Display Co., Ltd., Miaoli County (TW)

(72) Inventors: Yen-Chun Tseng, Miaoli County (TW); Tzu-Yang Lin, Miaoli County (TW); Yi-Chun Shih, Miaoli County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 0 days.

(21) Appl. No.: 17/106,193

(22) Filed: Nov. 30, 2020

(65) Prior Publication Data

US 2022/0173268 A1    Jun. 2, 2022

(51) Int. Cl.
| | | |
|---|---|---|
| *H01L 33/38* | (2010.01) | |
| *H01L 33/04* | (2010.01) | |
| *H01L 33/30* | (2010.01) | |
| *H01L 33/32* | (2010.01) | |
| *H01L 33/00* | (2010.01) | |

(52) U.S. Cl.
CPC .......... *H01L 33/0008* (2013.01); *H01L 33/04* (2013.01); *H01L 33/38* (2013.01); *H01L 33/30* (2013.01); *H01L 33/32* (2013.01)

(58) Field of Classification Search
CPC ..... H01L 33/0008; H01L 33/04; H01L 33/38; H01L 33/30; H01L 33/32
See application file for complete search history.

(56) References Cited

U.S. PATENT DOCUMENTS

| | | | | |
|---|---|---|---|---|
| 2013/0270604 | A1* | 10/2013 | Furukawa | H01L 33/38 257/99 |
| 2016/0035924 | A1* | 2/2016 | Oraw | H01L 31/0508 257/89 |
| 2018/0247922 | A1* | 8/2018 | Robin | H01L 33/007 |
| 2018/0301433 | A1* | 10/2018 | Robin | H01L 25/0753 |
| 2018/0331153 | A1* | 11/2018 | Robin | H01L 25/167 |

* cited by examiner

*Primary Examiner* — Mark W Tornow

(57) ABSTRACT

The present invention discloses a micro LED structure including a first semiconductor layer, a first electrode, a second electrode, and an active layer. The first semiconductor layer has two opposite sides defined as a first surface and a second surface. The first semiconductor layer has a doped region located therein and exposed on the first surface. A pn junction is formed between the doped region and the first semiconductor layer. The first electrode and the second electrode, located on the first surface, are capable of electrically connecting to the first semiconductor layer and the doped region respectively. The active layer is adjacent to the second surface. Wherein the first semiconductor layer is a first doping type, and the doped region is a second doping type different from the first doping type, and the first semiconductor layer and the pn junction are located at identical side of the active layer.

9 Claims, 8 Drawing Sheets

MICRO LED STRUCTURE

BACKGROUND OF THE INVENTION

1. Field of the Invention

The present invention pertains to a micro light emitting diode, in particular to a semiconductor structure of a micro light emitting diode.

2. Description of the Prior Art

Please refer to FIG. 1A. FIG. 1A is a schematic diagram illustrating a semiconductor structure of a conventional light emitting diode (LED). As shown in FIG. 1A, a n-type semiconductor layer 90, an active layer 91 and a p-type semiconductor layer 92 are stacked and formed on a substrate 93 in manufacturing a conventional LED. Since it is necessary to apply a driving current to the active layer 91, electrodes are usually disposed on the surfaces of the n-type semiconductor layer 90 and the p-type semiconductor layer 92, such the electrodes can be electrically connected to the power source by wire bonding. Taking FIG. 1A as an example, since the p-type semiconductor layer 92 is sandwiched between the active layer 91 and the substrate 93, there is no suitable place for electrodes to be disposed. In order to expose a part of the p-type semiconductor layer 92, the entire semiconductor structure will be platformed (e.g. mesa process), such as etching a part of the n-type semiconductor layer 90 and the active layer 91 from the above until the p-type semiconductor layer 92 is exposed. Please refer to FIG. 1B. FIG. 1B is a schematic diagram illustrating the structure of a conventional light emitting diode after being platformed. As shown in FIG. 1B, after the mesa process, the n-type semiconductor layer 90, the active layer 91, and the p-type semiconductor layer 92 will be formed into a stepped structure or a L-shaped structure. Next, an electrode 94 can be disposed on the n-type semiconductor layer 90, and an electrode 95 can be disposed on the p-type semiconductor layer 92.

In the convention mesa process as described above, however, parasitic leakage current is likely to be generated on the sidewall 96 of the n-type semiconductor layer 90, the active layer 91, and the p-type semiconductor layer 92 after being etched in the mesa process, leading to the luminous efficiency of the LED be reduced. Generally speaking, the leakage current caused by the mesa process on the sidewall 96 is called the mesa sidewall effect. The mesa sidewall effect may have even greater impact on the luminous efficiency for applying to the micro LEDs. Therefore, it is urgent that a new LED structure reducing the impact of the mesa sidewall effect be provided to this industry.

SUMMARY OF THE INVENTION

The present invention provides a micro LED structure, which does not require the mesa process and thereby avoids the impact of the mesa sidewall effect.

The present invention discloses a micro LED structure including a first semiconductor layer, a first electrode, a second electrode, and an active layer. The first semiconductor layer has two opposite sides defined as a first surface and a second surface. The first semiconductor layer has a doped region which is located therein and exposed on the first surface. A pn junction is formed between the doped region and the first semiconductor layer. The first electrode is located on the first surface and capable of electrically connecting to the first semiconductor layer. The second electrode is located on the first surface and capable of electrically connecting to the doped region. The active layer is adjacent to the second surface. The first semiconductor layer is a first doping type, and the doped region is a second doping type. The first doping type is different from the second doping type, and the first semiconductor layer and the pn junction are located at the same side of the active layer.

In some embodiments, the micro LED structure may further includes a first ohmic contact layer, disposed between the first electrode and the first surface, which contacts the first electrode and the first semiconductor layer respectively. Besides, the first ohmic contact layer and the second electrode are separated on the first surface by a first distance, and the first distance is between 0.5 µm and 80 µm. In addition, in the normal direction of the first surface, the ratio of an orthogonal projection area of the first electrode to the first ohmic contact layer may be between 0.01 and 1.5. Moreover, the first electrode is with a first thickness, the first ohmic contact layer is with a second thickness, the second electrode is with a third thickness, and the third thickness may be the sum of the first thickness and the second thickness.

In some embodiments, the second electrode may covers the doped region on the first surface. Besides, in the normal direction of the first surface, the ratio of an orthogonal projection area of the second electrode to the doped region may be between 0.5 to 2. In addition, the micro LED structure may further includes a second semiconductor layer, and the active layer is located between the first semiconductor layer and the second semiconductor layer. The second semiconductor layer may be the first doping type.

To summarize, the micro LED structure of the present invention forms the doped region in the first semiconductor layer, and make the doped region exposed on the first surface of the first semiconductor layer. In this way, the electrodes with different electric polarities can be directly disposed on the first surface, and can be electrically connected to the first semiconductor layer and the doped region, respectively. In other words, the micro LED structure does not require the mesa process, thereby avoiding the impact of the mesa sidewall effect and improving the luminous efficiency.

BRIEF DESCRIPTION OF THE APPENDED DRAWINGS

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1A:
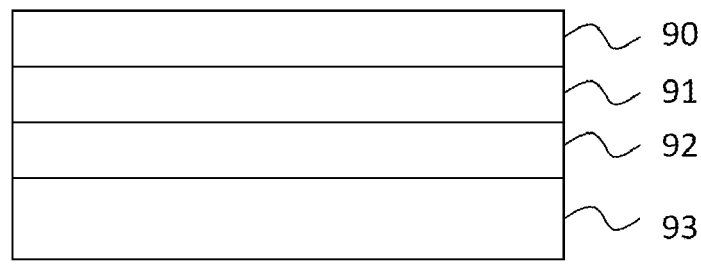
FIG. 1A is a schematic diagram of a traditional LED structure.
Figure 1B:
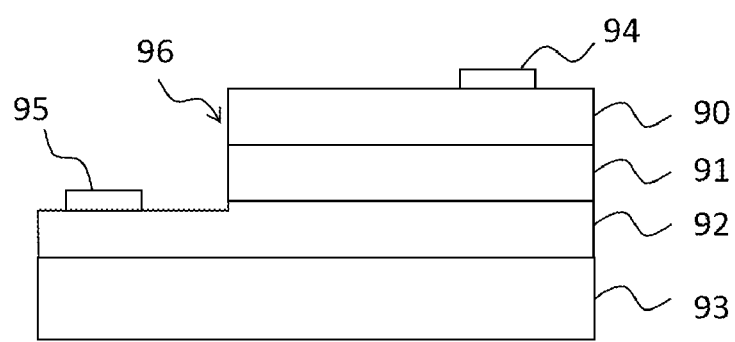
FIG. 1B is a schematic diagram of a traditional LED structure after the mesa process.
Figure 2:
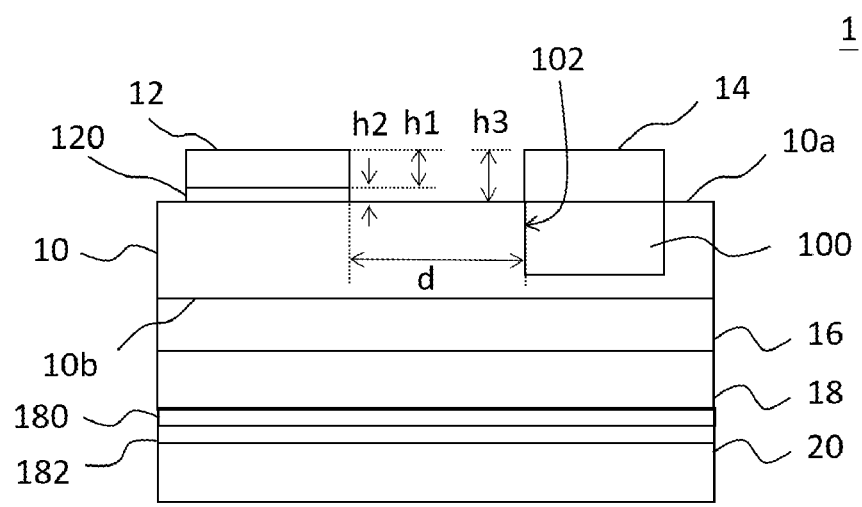
FIG. 2 is a schematic diagram of a micro LED structure in accordance with an embodiment of the present invention.

Please refer to FIG. 2, FIG. 2 is a schematic diagram of a micro LED structure in accordance with an embodiment of the present invention. As shown in FIG. 2, the micro LED structure 1 of this embodiment may be disposed on a substrate 20, and the micro LED structure 1 may include a first semiconductor layer 10, a first electrode 12, a second electrode 14, and the active layer 16. The substrate 20 may be a growth substrate or a temporary substrate which is transparent, but the invention is not limited thereto. In addition, the first semiconductor layer 10 may have n-type or/and p-type doping. For the convenience of description, an exemplary example that the first semiconductor layer 10 with the n-type doping is explained in the following embodiment.

The first semiconductor layer 10 may be a multilayer structure defined a first surface 10a and a second surface 10b thereon. Taking FIG. 2 as an example, the first surface 10a is a surface of the first semiconductor layer 10 facing upward, and the second surface 10b is a surface of the first semiconductor layer 10 facing downward. In addition, the first semiconductor layer 10 has a doped region 100. As the first semiconductor layer 10 is with the n-type doping (first doping type), the doped region 100 should be with a p-type doping (second doping type), so that a pn junction 102 can be formed between the doped region 100 with p-type doping and the first semiconductor layer 10 with the n-type doping. In practice, since the doped region 100 is located in the first semiconductor layer 10, and the doping types of the doped region 100 and the first semiconductor layer 10 are different, the pn junction 102 may be defined as each boundary/edge of the doped region 100. For the convenience of description, FIG. 2 shows the pn junction 102 located on the left boundary of the doped region 100, but the location of the pn junction 102 should not be a limitation to this embodiment. For example, the bottom or the right boundaries of the doped region 100 can also be regarded as one instantiation of the pn junctions 102.

In one example, the doped region 100 is formed by an ion implantation process or an ion diffusion process. For example, p-type dopants can be implanted or diffused downward from the first surface 10a into the first semiconductor layer 10 for creating the doped region 100. The doping concentration in the doped region 100 may be greater than $10^{17}$, and preferably be greater than $2 \times 10^{18}$. It can be seen from FIG. 2 that a part of the first surface 10a can be defined as the doped region 100, that is, the doped region 100 can be exposed on the first surface 10a. In addition, the ratio in thickness of the doped region 100 to the first semiconductor layer 10 does not limit the invention, for example, the thickness of the first semiconductor layer 10 may be altered between 2000 Å and 1 μm. In practice, since the doped region 100 is formed vertically from the first surface 10a into the first semiconductor layer 10, the structure of the first semiconductor layer 10 will not be damaged by etching. Therefore, the doped region 100 and the first semiconductor layer 10 may be substantially coplanar on the first surface 10a. In other words, the first surface 10a will be flat at the boundary of the doped region 100.

In the above example, the doped region 100 and the first semiconductor layer 10 can be made of the same material. In one example, the doped region 100 and the first semiconductor layer 10 may also be made of different materials. Besides, it is also possible to etch a groove in the first semiconductor layer 10 in the first place, and fill the groove with different materials to form the doped region 100. In other words, the doped region 100 and the first semiconductor layer 10 of the present invention should have different doping types.

Please continue to refer to FIG. 2, the first electrode 12 and the second electrode 14 may be on the same side of the first semiconductor layer 10, for example, both of the first electrode 12 and the second electrode 14 can be disposed on the first surface 10a. The first electrode 12 is capable of electrically connecting the first semiconductor layer 10, and the second electrode 14 is capable of electrically connecting the doped region 100. For the person having ordinary skilled in the art should understand the function of the first electrode 12 and the second electrode 12, and it will not be described in detail in this embodiment. In an example, in order that the first electrode 12 is with good conductivity, there may be a first ohmic contact layer 120 between the first electrode 12 and the first surface 10a. The first ohmic contact layer 120, for example, may contact the first electrode 12 and the first surface 10a of the first semiconductor layer 10. In practice, the doping concentration of the first ohmic contact layer 120 can be greater than $10^{17}$, and preferably be greater than $2 \times 10^{18}$.

Structurally, the first electrode 12 of this embodiment is with a first thickness h1, the first ohmic contact layer 120 is with a second thickness h2, and the second electrode 14 is with a third thickness h3. The second thickness h2 of the first ohmic contact layer 120 may be between 20 Å and 1000 Å, and the third thickness h3 may be the sum of the first thickness h1 and the second thickness h2. In other words, the top surface of the first electrode 12 and the top surface of the second electrode 14 are approximately at the same height and can be coplanar, so the yield can be enhanced while transferring to another circuit substrate (not shown in figures). In addition, the total thickness of the micro LED structure 1 may be less than 5 and the total width of the micro LED structure 1 may be less than 100 μm. In detail, assuming that both the first ohmic contact layer 120 and the second electrode 14 contact the first surface 10a directly, the minimum distance between the first ohmic contact layer 120 and the second electrode 14 on the first surface 10a can be defined as a first distance d. The first distance d may preferably be between 0.5 μm and 80 μm, avoiding that the tunneling effect between the first ohmic contact layer 120 and the second electrode 14 is insignificant when the first distance d is less than 0.5 μm.

In addition, although FIG. 2 illustrates that the width of the first electrode 12 is the same as the width of the first ohmic contact layer 120, and the width of the second electrode 14 is the same as the width of the doped region 100, the present invention is not limited as described herein. In an embodiment, the ratio of an orthogonal projection area of the first electrode 12 to the first ohmic contact layer 120 may be between 0.01 and 1.5 while viewing from above the first surface 10a (along the normal direction of the first surface 10a). Due to the small size of the micro LED structure 1, the first electrode 12 and the second electrode 14 may be too close causing a short circuit when said ratio is greater than 1.5. Besides, it can be considered that the first electrode 12 covers the first ohmic contact layer 120 when the orthogonal projection area of the first electrode 12 is greater than the orthogonal projection area of the first ohmic contact layer 120, and a part of the first electrode 12 may directly contact the first ohmic contact layer 120. In the case that the total width of the micro LED structure 1 is less than 50 µm, the first electrode 12 may further be connected to an external circuit (not shown). Therefore, with the larger bonding area, the bonding yield is expected to be increased, and the current is concentrated in the area of the first ohmic contact layer 120.

Figure 3:
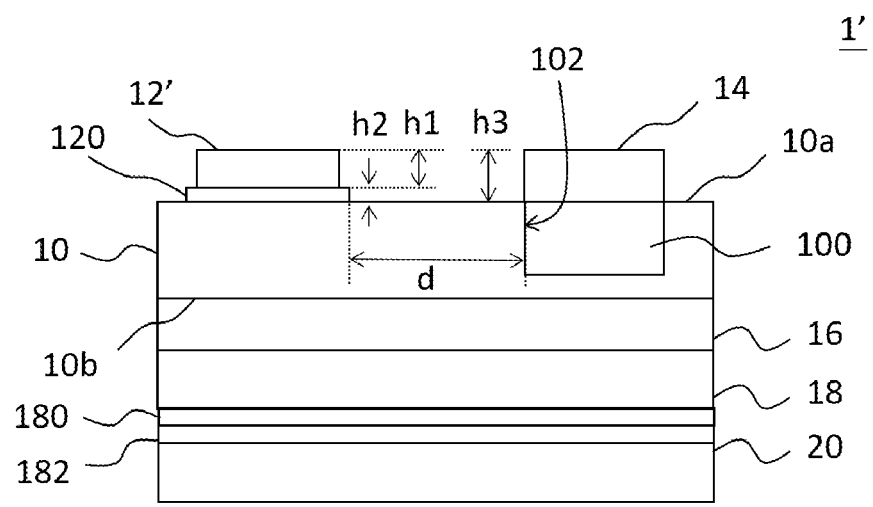
FIG. 3 is a schematic diagram of a micro LED structure in accordance with another embodiment of the present invention.

On the other hand, the above-mentioned orthogonal projection area of the first electrode 12 may also be smaller than the orthogonal projection area of the first ohmic contact layer 120. Please refer to FIG. 2 and FIG. 3 together, FIG. 3 is a schematic diagram of a micro LED structure in accordance with another embodiment of the present invention. The difference between the micro LED structure 1' in FIG. 3 and the micro LED structure 1 in FIG. 2 is that the size of the first electrode 12' is different from the size of the first electrode 12. As shown in FIG. 3, when the projected area of the first electrode 12' is smaller than the projected area of the first ohmic contact layer 120, it can be regarded that the first electrode 12' is located within the periphery of the first ohmic contact layer 120, so that the first electrode 12' will not directly contact the first surface 10a. Taking FIG. 2 as an example, when the orthogonal projection area of the first electrode 12 is exactly equal to the orthogonal projection area of the first ohmic contact layer 120, it can be regarded that the first electrode 12 just overlaps the first ohmic contact layer 120. Under the circumstances, the minimum distance between the first electrode 12 and the second electrode 14 on the first surface 10a is the first distance d, and the first distance d can be between 0.5 µm and 80 µm. The tunneling effect between the first electrode 12 and the second electrode 14 may be insignificant if the first distance d is less than 0.5 µm as mentioned.

Figure 4:
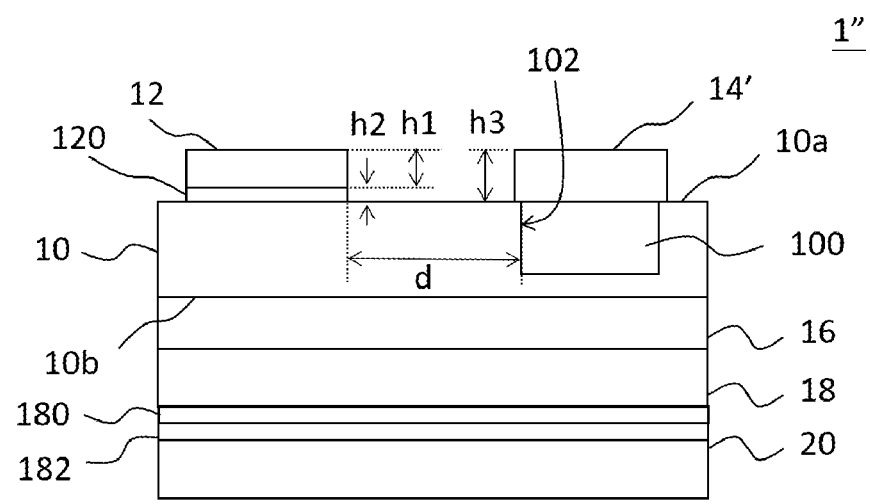
FIG. 4 is a schematic diagram of a micro LED structure in accordance with further another embodiment of the present invention.

Similarly, the ratio of the orthogonal projection area of the second electrode 14 to the doped region 100 is between 0.5 and 2 while viewing from above the first surface 10a. In the case that the ratio is larger than 2, the distance between the first electrode 12 and the second electrode 14 may be too close causing a short circuit because the micro LED structure 1 is quite small. Please refer to FIG. 2 and FIG. 4 together, FIG. 4 is a schematic diagram of a micro LED structure in accordance with further another embodiment of the present invention. The difference between the micro LED structure 1" in FIG. 4 and the micro light emitting diode structure 1 in FIG. 2 is that the size of the second electrode 14' is different from the size of the second electrode 14. As shown in FIG. 4, it can be regarded that the second electrode 14' covers the exposed doped region 100 of the first surface 10a when the orthogonal projection area of the second electrode 14' is larger than the orthogonal projection area of the doped region 100, and a part of the second electrode 14' may directly contact the first semiconductor layer 10 outside the periphery of the doped region 100. Under the circumstances, the second electrode 14' and the first semiconductor layer 10 may be in non-ohmic contact, such as insulation or forming a Schottky junction. On the other hand, FIG. 2 shows that the orthogonal projection area of the second electrode 14 may be smaller than or equal to the orthogonal projection area of the doped region 100. As such case, it can be regarded that the second electrode 14 is located within the periphery of the doped region 100 exposed on the first surface 10a, so that the second electrode 14 will not directly contact the first semiconductor layer 10. In one example, the second electrode 14 covering the exposed doped region 100 on the first surface 10a may facilitate wiring and alignment processes. In addition, the first electrode 12 and the second electrode 14 may separated by more than 1 µm from the edge of the first surface 10a, respectively. The distance between the electrode 12 and the edge of the first surface 10a may be unequal to the distance between the second electrode 14 and the edge of the first surface 10a.

Figure 5:
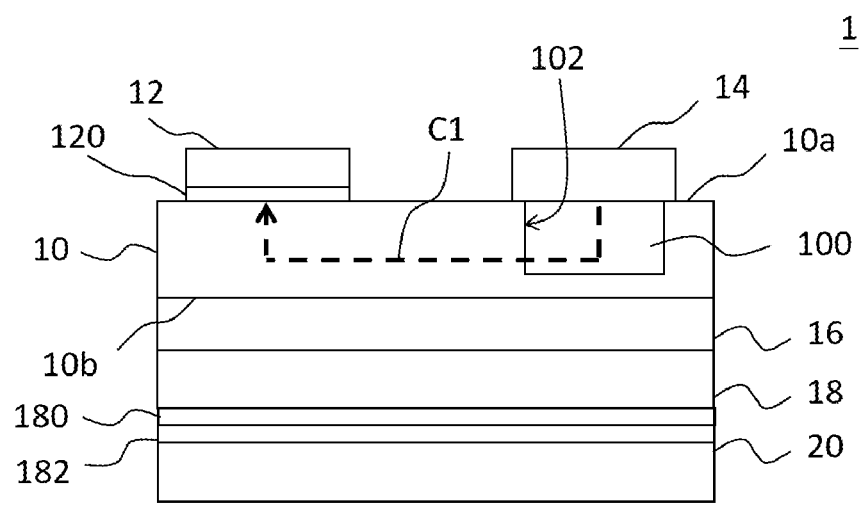
FIG. 5 is a schematic diagram illustrating the current of a micro LED structure in accordance with an embodiment of the present invention.

The active layer 16 is adjacent to the second surface 10b of the first semiconductor layer 10. As shown in FIG. 2, the active layer 16 may be under the first semiconductor layer 10. Since the pn junction 102 is located within the first semiconductor layer 10, and the active layer 16 is below the first semiconductor layer 10, it can be said that the first semiconductor layer 10 and the pn junction 102 are located on the same side of the active layer 16, or said that the pn junction surface 102 and the active layer 16 are located on the opposite sides of the second surface 10b respectively. Please refer to FIG. 2 and FIG. 5, FIG. 5 is a schematic diagram illustrating the current of a micro LED structure in accordance with an embodiment of the present invention. As shown in the figures, when a voltage drop is applied between the first electrode 12 and the second electrode 14, due to the characteristics of p-type and n-type semiconductors, current will occur at the pn junction 102, and the current flow can be roughly expressed as the horizontal current path C1. Although the current path C1 seems not to pass through the active layer 16, the current can still pass through the active layer 16 located below due to the tunneling effect. In other words, different from the traditional LED that in which the active layer is excited by the voltage and current in the vertical direction to emit light, the micro LED structure 1 of this embodiment is provided with the active layer 16 under the current path C1, and the active layer 16 can be excited by the voltage and current in the horizontal direction to emit light. In particular, under the circumstance that the LED is narrowed to a micron-size or a smaller size, because the thickness of the first semiconductor layer 10 is much thinner than that of the traditional LED, the current path C1 shown in FIG. 5 is closer to the active layer 16. Moreover, the ratio of the width of the first electrode 12 (or the second electrode 14) to the micro LED structure 1 is also greatly increased than the traditional LED, hence the current path C1 is majorly parallel to the active layer 16 to make the tunneling effect more significant. Preferably, the distance between the bottom of the doped region 100 and the active layer 16 is within 2000 Å to have more efficient tunneling effect.

In one example, the material of the active layer 16 can be, but not limited thereto, selected from the group consisting of $Al_xGa_yIn_{1-x-y}As$ and $Al_xGa_yIn_{1-x'-y'}As$, $Al_xGa_yIn_{1-x-y}P$ and $Al_xGa_yIn_{1-x'-y'}P$, $GaP_yAs_{1-y}$ and $GaP_{y'}As_{1-y'}$, and/or $Al_xGa_yIn_{1-x-y}N$ and $Al_xGa_yIn_{1-x'-y'}N$. In addition, the active layer 16 can also be, but not limited thereto, a DH (double heterojunction) structure, a SQW (single quantum well) structure, or an MQW (multiple quantum well) structure.

Please continue to refer to FIG. 2. In this embodiment, a second semiconductor layer 18 may further be provided under the active layer 16, such that the active layer 16 is located between the first semiconductor layer 10 and the second semiconductor layer 18. This embodiment is not limit by the doping type of the second semiconductor layer 18. For example, the doping type of the second semiconductor layer 18 may be n-type or p-type, and even the second semiconductor layer 18 may be undoped. Preferably, in order to improve the luminous efficiency of the micro LED structure 1, the doping type of the second semiconductor layer 18 can be opposite to the doping type of the doped region 100, and be the same as that of the first semiconductor layer 10. The doping concentration of the second semiconductor layer 18 may be less than or equal to $10^{17}$. In an example, the material of the first semiconductor layer 10, the first ohmic contact layer 120, and the second semiconductor layer 18 may be selected from $Al_xGa_yIn_{1-x-y}As$, $Al_xGa_yIn_{1-x-y}P$, $GaP_yAs_{1-y}$, or $Al_xGa_yIn_{1-x-y}N$. The materials of the first semiconductor layer 10, the first ohmic contact layer 120, and the second semiconductor layer 18 can be the same or different.

In addition, in the micro LED structure 1 shown in FIG. 5, it is further described that the second semiconductor layer 18 may further include a sub-layer 180 and a dielectric layer 182. The refractive index of the sub-layer 180 may be between the refractive index of air and the refractive index of the second semiconductor layer 18. The surface of the sub-layer 180 and the dielectric layer 182 can be flat. However, in order to increase the light extraction efficiency, the surfaces of the dielectric layer 182 and a dielectric layer 182 can be roughened or provided with optical structures. In practice, the refractive index of the material of the dielectric layer 182 is smaller than the refractive index of the second semiconductor layer 18, and also smaller than the refractive index of the sub-layer 180. The dielectric layer 182 may be a multilayer structure, for example, it may be stacked with various materials such as silicon oxide ($SiO_x$) and titanium dioxide ($TiO_2$). In one embodiment, the thickness of the dielectric layer 182 is not greater than 2 μm.

Figure 6:
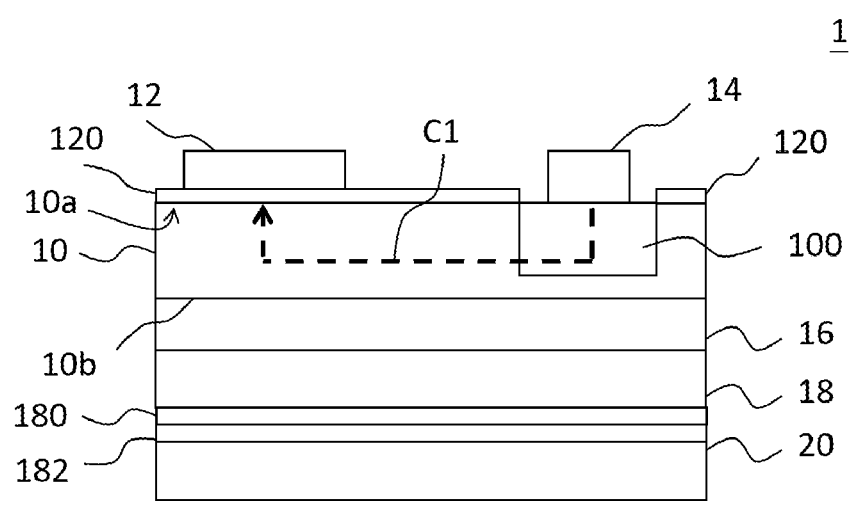
FIG. 6 is a schematic diagram of a micro LED structure in accordance with still another embodiment of the present invention.

FIG. 6 is a schematic diagram of a micro LED structure in accordance with still another embodiment of the present invention. As shown in FIG. 6, the first ohmic contact layer 120 may cover most of the area of the first surface 10a of the first semiconductor layer 10, and expose the first surface 10a corresponding to the position of the doped region 100. The first ohmic contact layer 120 can be implemented before the second electrode 14 is formed, and thereafter removing a part of the first ohmic contact layer 120 corresponding to the position of the second electrode 14 by a lithography process, thereby separating the first ohmic contact layer 120 from the second electrode 14.

For some micro LEDs, under the condition that the wavelength of the emitted light is not absorbed by the first ohmic contact layer 120 (such as blue light and green light), a larger first ohmic contact layer 120 can be applied to increase the contact surface with the first semiconductor layer 10, thereby improving the electrical performance of the micro LED structure 1. In an embodiment, the ratio of the orthogonal projection area of the first electrode 12 to the first ohmic contact layer 120 may be between 0.01 and 1.5 while viewing from above the first surface 10a (along the normal direction of the first surface 10a). For some micro LEDs, under the condition that the wavelength of the emitted light is absorbable by the first ohmic contact layer 120 (such as red light), a smaller area of the first ohmic contact layer 120 can reduce the absorption of red light to enhance the luminous efficiency of the red light micro LED structure. In an embodiment, the ratio of the orthogonal projection area of the first electrode 12 to the first ohmic contact layer 120 may be between 0.1 and 1.5 while viewing from above the first surface 10a (along the normal direction of the first surface 10a).

Figure 7:
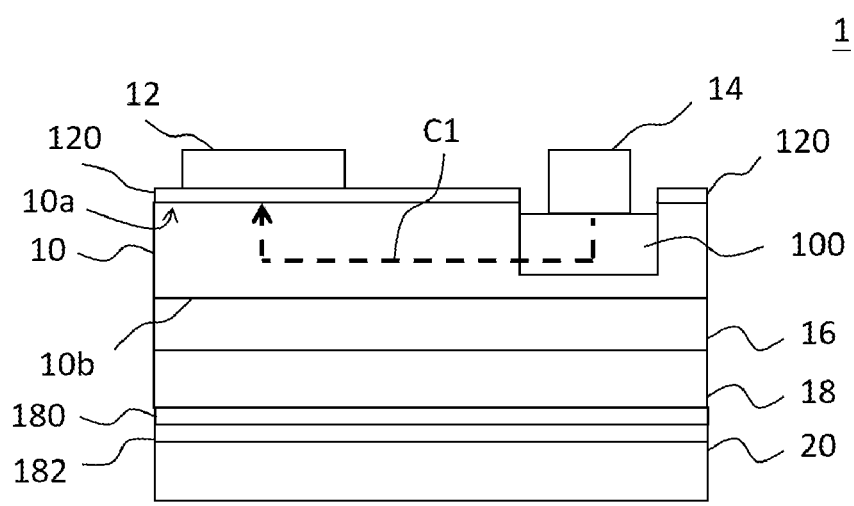
FIG. 7 is a schematic diagram of a micro LED structure in accordance with still another embodiment of the present invention.

FIG. 7 is a schematic diagram of a micro LED structure in accordance with still another embodiment of the present invention. In addition to the increase in the covered area of the first ohmic contact layer 120, the difference between FIG. 7 from FIG. 6 is that a part of the first semiconductor layer 10 is etched from the first surface 10a at the corresponding position of the doped region 100. As described in FIG. 6, at the position corresponding to the second electrode 14, the first ohmic contact layer 120 will be removed to expose the first surface 10a. In FIG. 7, the first semiconductor layer 10 can be further etched from the first surface 10a. Since the portion of the first semiconductor layer 10 adjacent to the first surface 10a is heavily doped, the dopant of second doping type, after said heavily doped portion is removed, can be easily doped into the doped region 100.

It can be seen from the description of FIG. 6 and FIG. 7 that the first ohmic contact layer 120 and the first semiconductor layer 10 can be simultaneously etched in the same pattern by using the lithography process, which not only increases the contact area between the first ohmic contact layer 120 and the first semiconductor layer 10, but also increase the doping concentration of the doped region 100, so that the electrical performance of the second electrode 14 can be improved.

To summarize, the micro LED structure of the present invention can form the doped region in the first semiconductor layer, and make the doped region exposed on the first surface of the first semiconductor layer. In this way, the electrodes of different electric polarities can be directly disposed on the first surface, and can be electrically connected to the first semiconductor layer and the doped region, respectively. In other words, the micro LED structure does not require the mesa process, thereby avoiding the impact of the mesa sidewall effect and improving the luminous efficiency.

What is claimed is:
1. A micro LED structure, comprising:
   a first semiconductor layer having two opposite sides defined as a first surface and a second surface, and the first semiconductor layer having a doped region located therein and exposed on the first surface, and a pn junction is formed between the doped region and the first semiconductor layer;
   a first electrode, located on the first surface, for electrically connecting to the first semiconductor layer;
   a second electrode, located on the first surface, for electrically connecting to the doped region; and
   an active layer adjacent to the second surface;
   wherein the first semiconductor layer is a first doping type, and the doped region is a second doping type different from the first doping type, and the first semiconductor layer and the pn junction are located at the same side of the active layer.

2. The micro LED structure according to claim 1, further comprising:
   a first ohmic contact layer, disposed between the first electrode and the first surface, contacting the first electrode and the first semiconductor layer respectively.

3. The micro LED structure according to claim 2, wherein the first ohmic contact layer and the second electrode are separated on the first surface by a first distance, and the first distance is between 0.5 μm and 80 μm.

4. The micro LED structure according to claim 2, wherein in the normal direction of the first surface, the ratio of an orthogonal projection area of the first electrode to the first ohmic contact layer is between 0.01 and 1.5.

5. The micro LED structure according to claim 2, wherein the first electrode is with a first thickness, the first ohmic contact layer is with a second thickness, the second electrode is with a third thickness, and the third thickness is the sum of the first thickness and the second thickness.

6. The micro LED structure according to claim 1, wherein the second electrode covers the doped region on the first surface.

7. The micro LED structure according to claim 1, wherein in the normal direction of the first surface, the ratio of an orthogonal projection area of the second electrode to the doped region is between 0.5 to 2.

8. The micro LED structure according to claim 1, further comprising a second semiconductor layer, wherein the active layer is located between the first semiconductor layer and the second semiconductor layer.

9. The micro LED structure according to claim 8, wherein the second semiconductor layer is the first doping type.

* * * * *